United States Patent
Kim et al.

(10) Patent No.: US 12,017,500 B2
(45) Date of Patent: Jun. 25, 2024

(54) BELLOWS CONNECTED HEAT EXCHANGERS FOR COOLING ELECTRICAL ELEMENTS OF A VEHICLE

(71) Applicant: KOHSAN CO., LTD., Asan-Si (KR)

(72) Inventors: Young Il Kim, Pyeongtaek-Si (KR); Kwan Kyo Chai, Sejong-si (KR); Gyu Young Jeong, Asan-si (KR); Jeong Hui Kim, Yangju-Si (KR)

(73) Assignee: KOHSAN CO., LTD., Asan-si (KR)

( * ) Notice: Subject to any disclaimer, the term of this patent is extended or adjusted under 35 U.S.C. 154(b) by 491 days.

(21) Appl. No.: 17/422,551

(22) PCT Filed: Feb. 6, 2020

(86) PCT No.: PCT/KR2020/001681
§ 371 (c)(1),
(2) Date: Jul. 13, 2021

(87) PCT Pub. No.: WO2020/171436
PCT Pub. Date: Aug. 27, 2020

(65) Prior Publication Data
US 2022/0097477 A1   Mar. 31, 2022

(30) Foreign Application Priority Data
Feb. 19, 2019 (KR) .......................... 10-2019-0019078

(51) Int. Cl.
*B60H 1/00* (2006.01)
*H05K 7/20* (2006.01)

(52) U.S. Cl.
CPC ..... *B60H 1/00271* (2013.01); *H05K 7/20272* (2013.01)

(58) Field of Classification Search
CPC ............ B60H 1/00271; B60H 1/00278; H05K 7/20272; H05K 7/20927; H05K 7/20845; H05K 7/20872; H05K 7/20881
See application file for complete search history.

(56) References Cited

U.S. PATENT DOCUMENTS 5,794,691 A * 8/1998 Evans .................. F28F 9/0248
                                                          165/170
6,324,759 B1 * 12/2001 Sasano ................. F28F 9/0246
                                                         29/890.03

(Continued)

FOREIGN PATENT DOCUMENTS

JP          2007205543 A      8/2007
KR    1020050081841 A      8/2005

(Continued)

OTHER PUBLICATIONS

Korean Intellectual Property Office, "International Search Report for PCT Application No. PCT/KR2020/001681", Korea, May 14, 2020.

*Primary Examiner* — Travis Ruby
(74) *Attorney, Agent, or Firm* — Locke Lord LLP; Tim Tingkang Xia, Esq.

(57) ABSTRACT

A heat exchanger for cooling electrical elements of a vehicle includes a pair of coolers disposed over and under an electrical element module, respectively, and each having a plurality of channels longitudinally formed to pass cooling fluid; pipe couplers respectively coupled to first ends of the pair of coolers to pass cooling fluid, having protrusions on first surfaces facing each other, respectively, and connected with pipes on second surfaces; bellows couplers respectively coupled to second ends of the pair of coolers to pass cooling fluid and having protrusions on first surfaces facing each other; and a bellows having top and bottom openings fitted on the protrusions, and being able to contract. The bellows (Continued)

couplers have grooves formed around the protrusions in a shape corresponding to the bellows, and widths of the grooves are larger than a width of the bellows.

4 Claims, 7 Drawing Sheets

(56) References Cited

U.S. PATENT DOCUMENTS

| | | | | |
|---|---|---|---|---|
| 2005/0121173 | A1* | 6/2005 | Inagaki | F28F 9/0236 |
| | | | | 257/E23.098 |
| 2008/0011456 | A1* | 1/2008 | Meshenky | F02M 26/11 |
| | | | | 165/83 |
| 2017/0301610 | A1* | 10/2017 | Tomita | F28F 9/001 |
| 2018/0064000 | A1* | 3/2018 | Uneme | H05K 7/20927 |

FOREIGN PATENT DOCUMENTS

| | | |
|---|---|---|
| KR | 1020090022204 A | 3/2009 |
| KR | 1020170079191 A | 7/2017 |
| KR | 1020180077461 A | 7/2018 |

\* cited by examiner

BELLOWS CONNECTED HEAT EXCHANGERS FOR COOLING ELECTRICAL ELEMENTS OF A VEHICLE

TECHNICAL FIELD OF THE INVENTION

The prevent invention relates to a heat exchanger for cooling electrical elements of a vehicle and, in detail, a heat exchanger for cooling electrical elements of a vehicle in which the possibility of leakage of cooling water can be reduced and the gap between the top and the bottom can be adjusted within a larger width.

BACKGROUND OF THE INVENTION

Eco-friendly vehicles such as an electric vehicle or a hybrid vehicle supply power using a motor and are required to use a power module, in which elements such as an insulated gate bipolar transistor (IGBT) and a diode are integrated, in order to more efficiently control the motor.

The IGBT and the diode of a power module each generate heat close to 200° C. when a vehicle is driven or stopped, so when the heat of the power module is accumulated, the motor is not driven, which may cause a severe accident during driving. Accordingly, a heat management system for a power module is necessary for eco-friendly vehicles.

Since a power module outputs maximum efficiency at an appropriate temperature and all of the elements are organically operated, if the efficiency of one element is deteriorated, the entire efficiency is deteriorated, so the elements should be uniformly cooled.

Since a heat exchanger for cooling electrical elements should simultaneously cool the upper portion and the lower portion of a power module, a heat exchange extrusion tube or a channel of a press article should be positioned at the upper and lower portions of the power module. In detail, a power module applied with thermal grease may be inserted between an upper cooler and a lower cooler. In this case, it is preferable that the power module is inserted such that the cooling water of the upper and lower coolers does not leak.

Heat exchangers for cooling electrical elements of an eco-friendly vehicle that have been recently developed to satisfy this condition may be classified in a bending type and a gasket type in a broad meaning.

The bending type is formed in an integral type by bending an extrusion tube in a 'U' shape or an 'Ω' shape using softness of the tube and the gasket type is a type in which a gasket ring is fitted on the joint between an upper channel and a lower channel to tighten the joint.

According to the bending type, when the heights of the extrusion tube and the channel are high, the extrusion tube should be bent much, so there is a defect that a large space is required, the shape of the channel cannot be varied, and the length that the extrusion tube occupies increases, so a pressure loss increases.

According to the gasket type, although the height of the channel is not limited, since one more gasket ring is fitted on the joint between the upper channel and the lower channel, there is a possibility of cooling water leaking due to twist of the gasket ring, etc. in assembly.

SUMMARY OF THE INVENTION

Technical Problem

The present invention has been made in an effort to solve the general problems in the related art described above and an object of the present invention is to provide a heat exchanger for cooling electrical elements of a vehicle in which the possibility of leakage of cooling water can be reduced and the gap between the top and the bottom can be adjusted within a larger width.

Technical Solution

In order the achieve the objects of the present invention, a heat exchanger for cooling electrical elements of a vehicle according to the present invention includes: a pair of coolers disposed over and under an electrical element module, respectively, and each having a plurality of channels longitudinally formed to pass cooling fluid; pipe couplers respectively coupled to first ends of the pair of coolers to pass cooling fluid, having protrusions on first surfaces facing each other, respectively, and connected with pipes on second surfaces; bellows couplers respectively coupled to second ends of the pair of coolers to pass cooling fluid and having protrusions on first surfaces facing each other; and a bellows having top and bottom openings fitted on the protrusions, and being able to contract.

The bellows couplers have grooves formed around the protrusions in a shape corresponding to the bellows, and the widths of the grooves are larger than the width of the bellows.

The bellows is configured such that the upper and lower parts are separable.

The pipe couplers each have a first stopping step that is formed on the inner surface thereof and limits an insertion position of the first end of each of the pair of coolers.

The bellows couplers each have a second stopping step that is formed on the inner surface thereof and limits an insertion position of the second end of each of the pair of coolers.

Advantageous Effects

According to the heat exchanger for cooling electrical elements of a vehicle, the possibility of leakage of cooling water may be reduced and the gap between the top and the bottom may be adjusted within a larger width.

According to the heat exchanger for cooling electrical elements of a vehicle, there is an effect that even though force is transmitted to the second coupler through the pipe when a connector, a hose, etc. are fastened to the pipe, the second coupler is not easily deformed because the second coupler is supported by the protrusion of the first coupler.

According to the heat exchanger for cooling electrical elements of a vehicle, since the bellows may be divided, there is the advantage that it is possible to more easily manufacture a bellows of which a side is a brazing part that is a clad material in comparison to the integral type heat exchangers of the related art.

According to the heat exchanger for cooling electrical elements of a vehicle, since the first and second stopping steps are formed at the pipe coupler and the bellows coupler, respectively, both ends of a plurality of coolers are disposed at predetermined positions, so combination is easy.

DETAILED DESCRIPTION OF THE INVENTION

Figure 1:
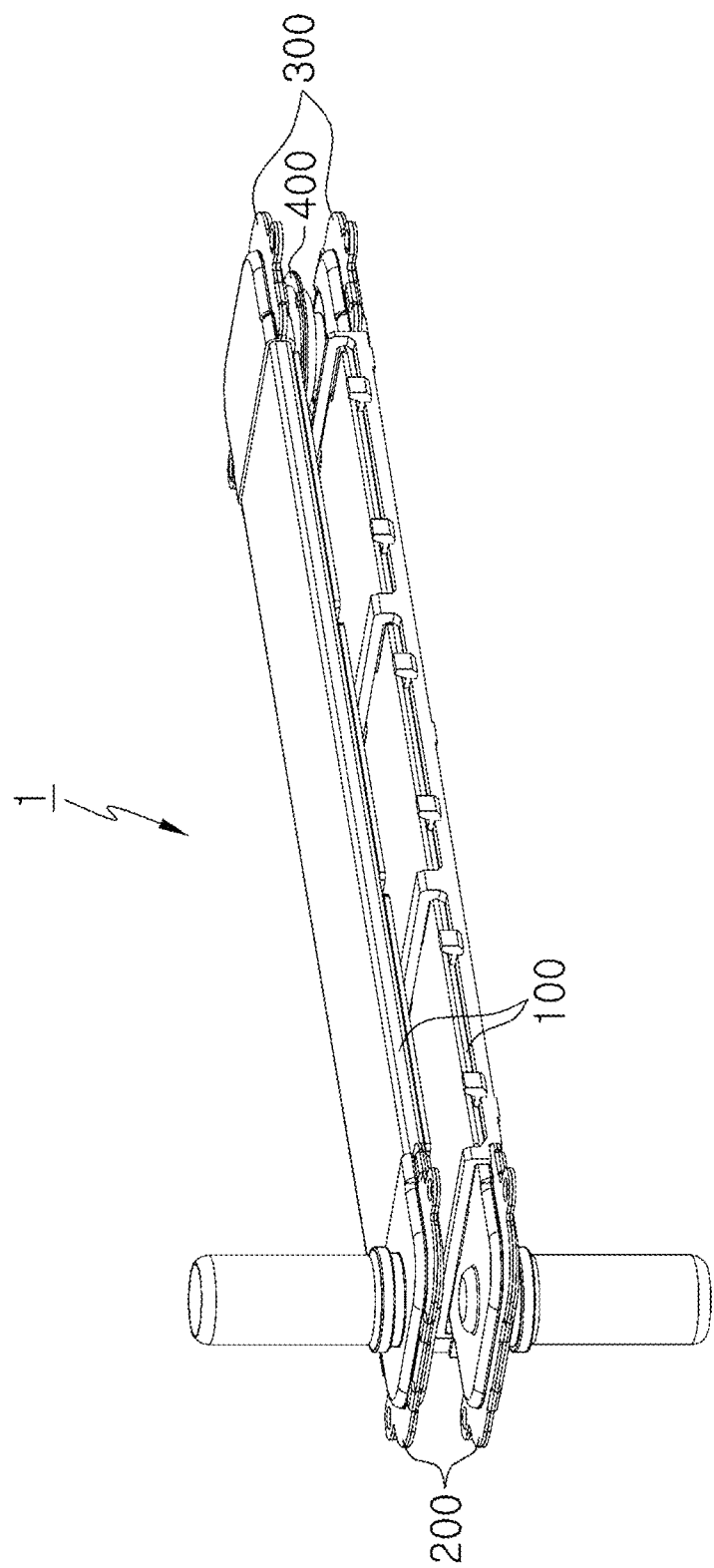
FIG. 1 is a perspective view of a heat exchanger for cooling electrical elements of a vehicle according to the present invention.

Hereinafter, embodiments of the present invention will be described in detail with reference to the accompanying drawings. It should be noted that when components are given reference numerals in drawings, the same components are given the same reference numerals even if they are shown in different drawings. Further, when a component may make the spirit of the present disclosure unclear, the component is not described in detail. Further, it should be noted that although embodiments of the present disclosure will be described below, the spirit of the present disclosure is not limited thereto and may be achieved by those skilled in the art.

Figure 2:
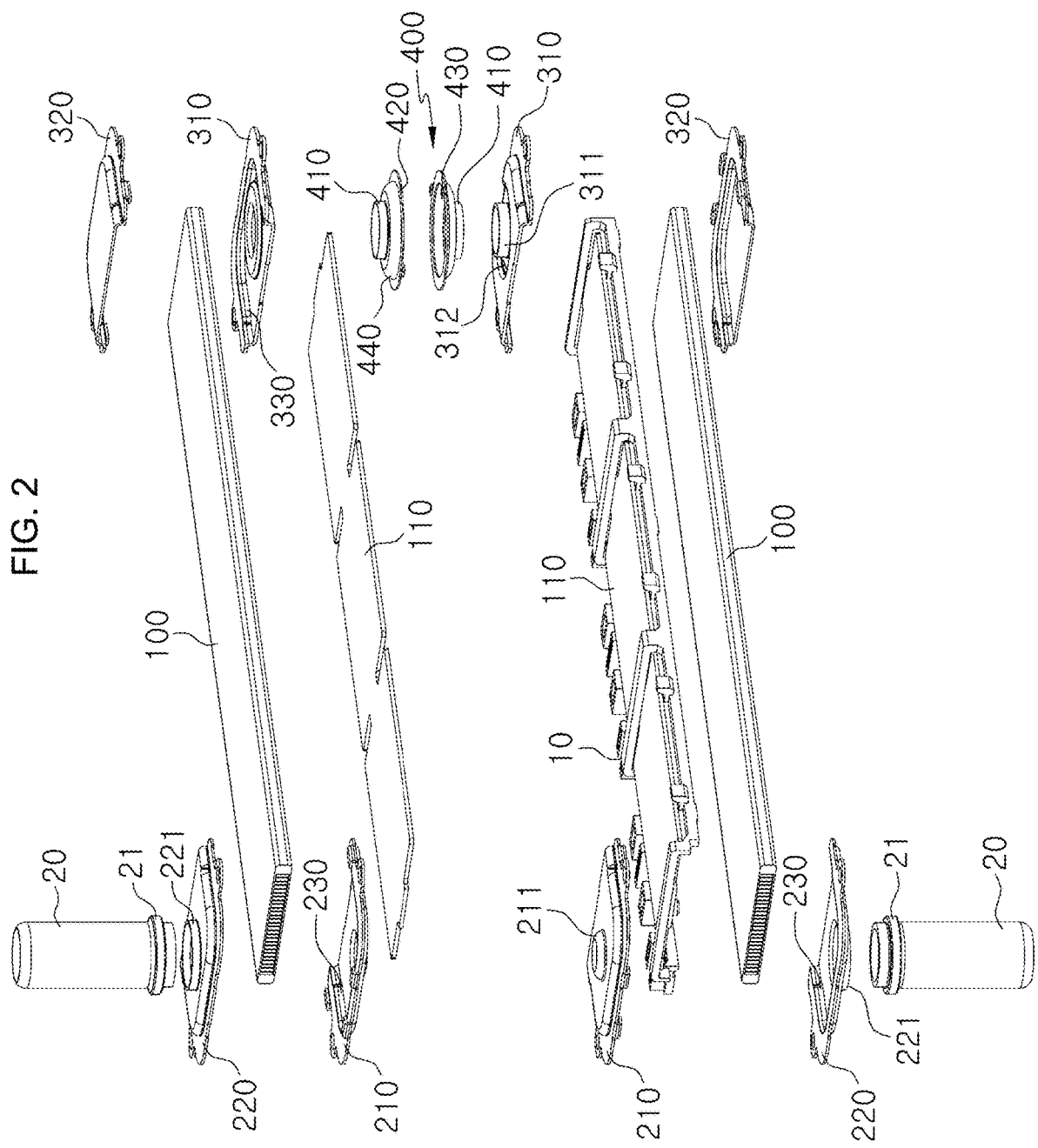
FIG. 2 is an exploded perspective view of the heat exchanger for cooling electrical elements of a vehicle according to the present invention.
Figure 3:
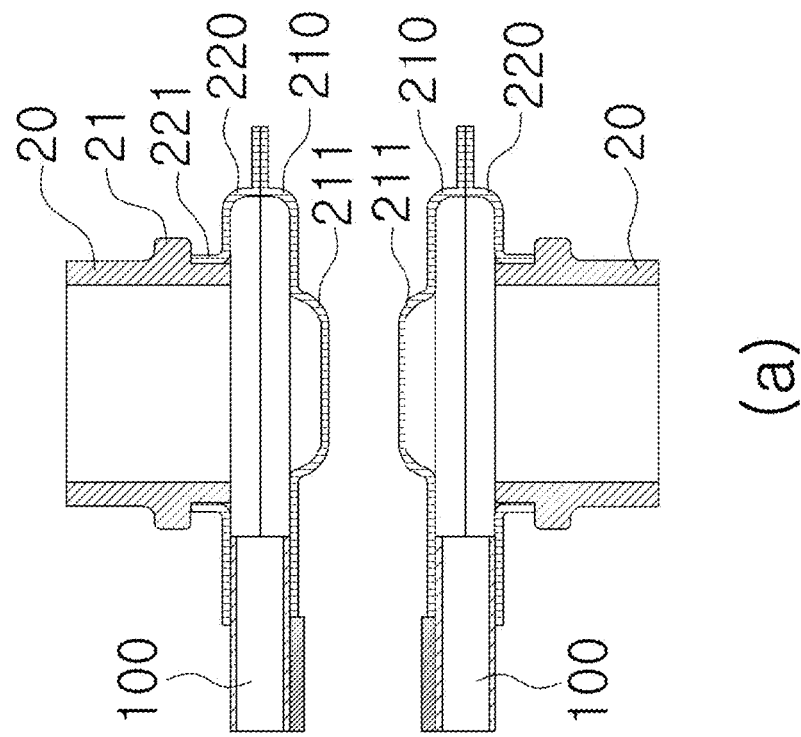
FIG. 3 is an enlarged cross-sectional view showing a pipe coupler in the heat exchanger for cooling electrical elements of a vehicle according to the present invention.
Figure 4:
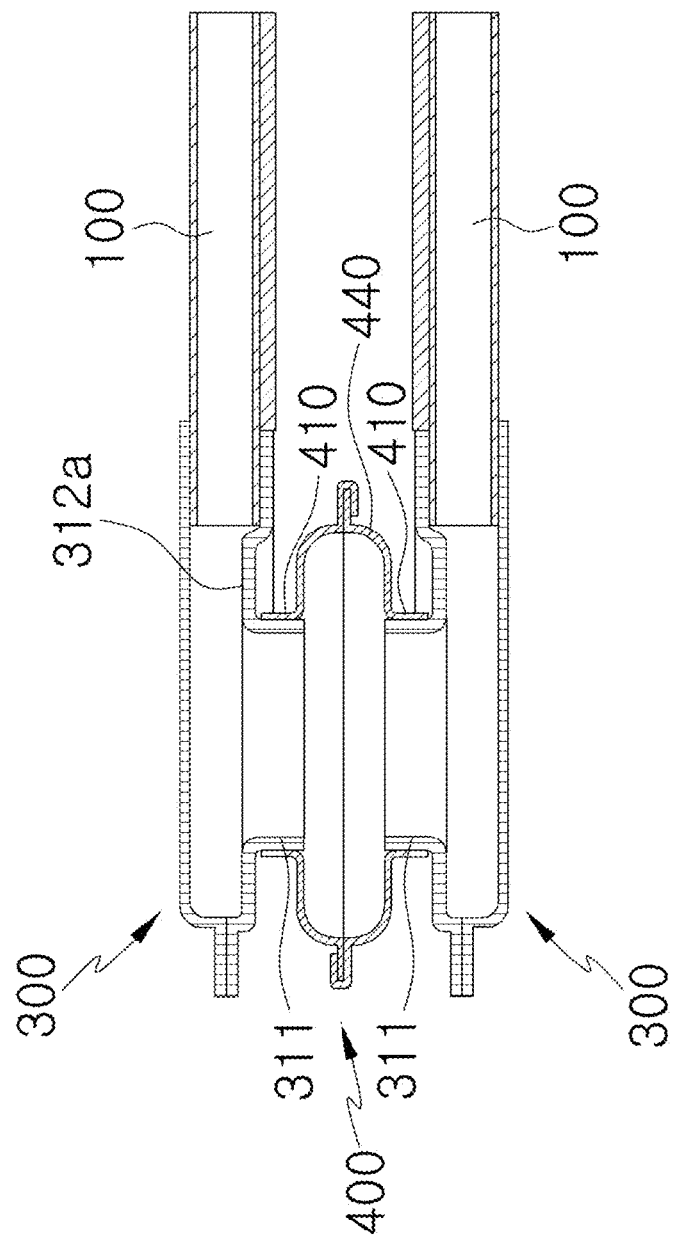
FIG. 4 is an enlarged cross-sectional view showing a bellows coupler and a bellows in the heat exchanger for cooling electrical elements of a vehicle according to the present invention.
Figure 5:
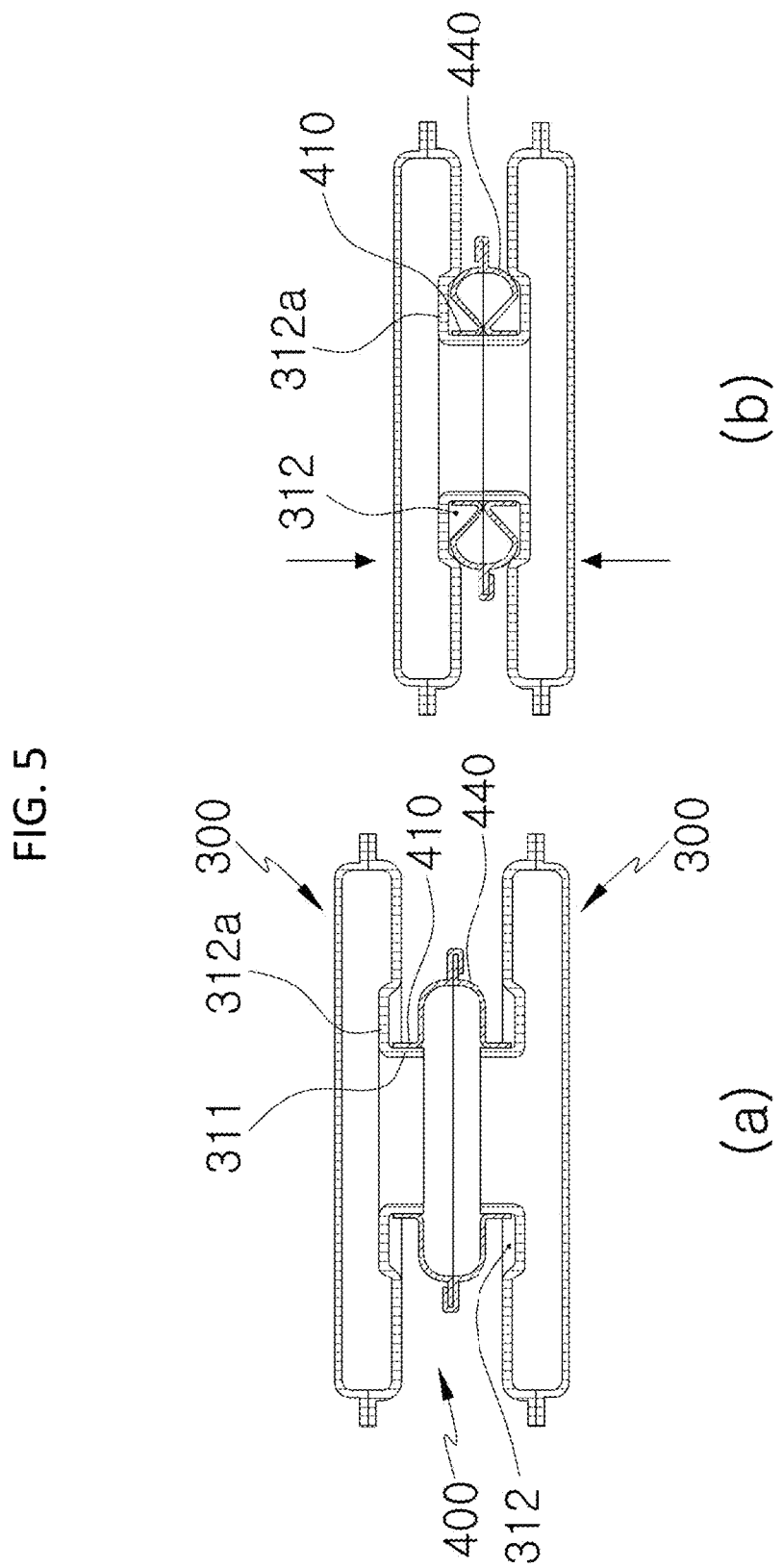
FIG. 5 is an enlarged cross-sectional view showing states before and after contraction of the bellows coupler and the bellows in the heat exchanger for cooling electrical elements of a vehicle according to the present invention.
Figure 6:
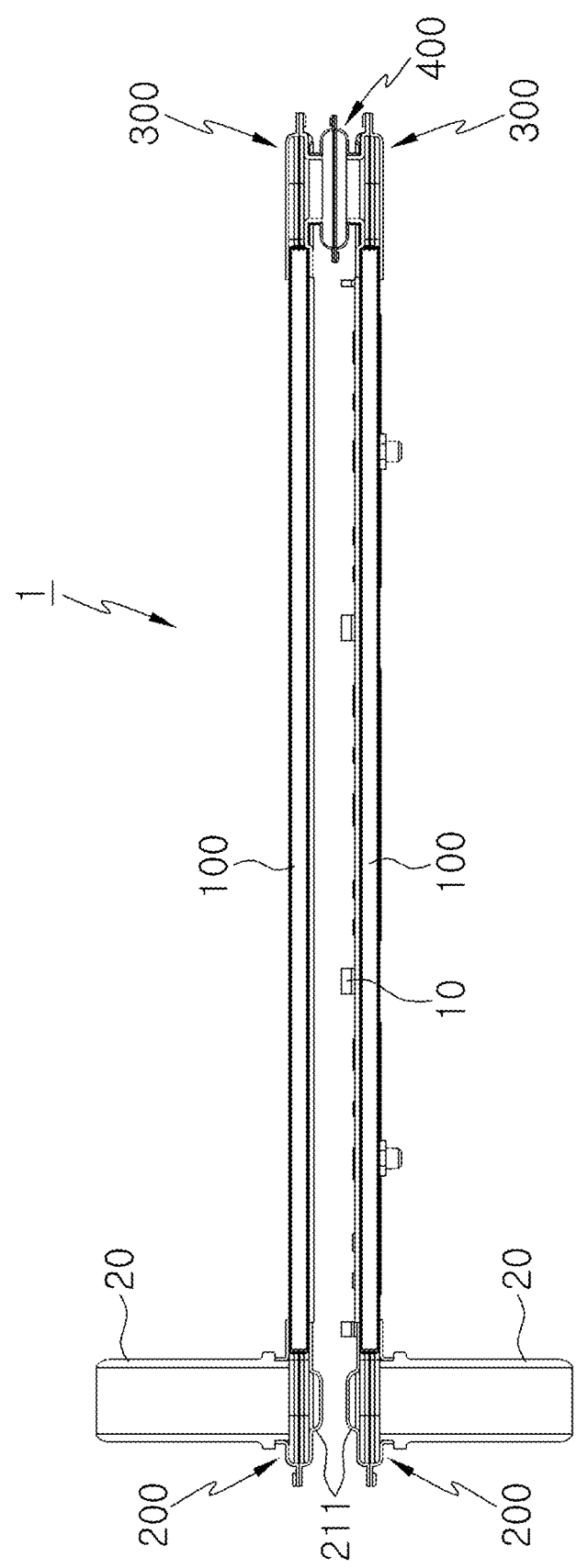
FIG. 6 is a front cross-sectional view showing the state before contraction of the heat exchanger for cooling electrical elements of a vehicle according to the present invention.
Figure 7:
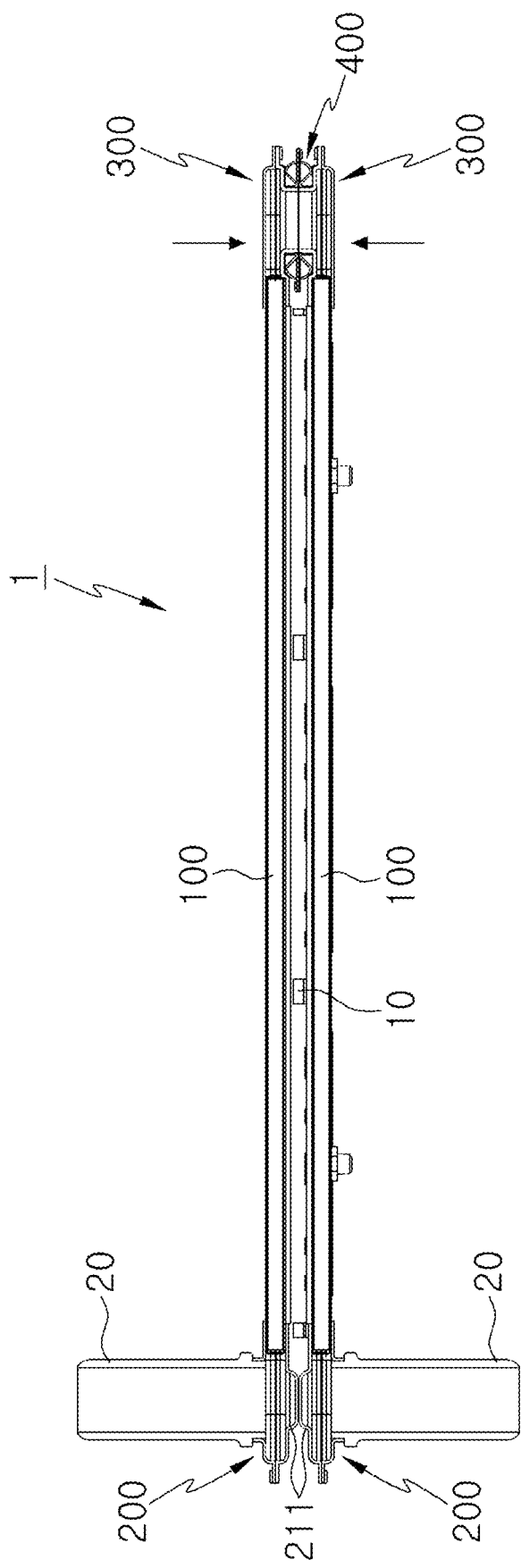
FIG. 7 is a front cross-sectional view showing the state after contraction of the heat exchanger for cooling electrical elements of a vehicle according to the present invention.

FIG. 1 is a perspective view of a heat exchanger for cooling electrical elements of a vehicle according to the present invention, FIG. 2 is an exploded perspective view of the heat exchanger for cooling electrical elements of a vehicle according to the present invention, FIG. 3 is an enlarged cross-sectional view showing a pipe coupler in the heat exchanger for cooling electrical elements of a vehicle according to the present invention, FIG. 4 is an enlarged cross-sectional view showing a bellows coupler and a bellows in the heat exchanger for cooling electrical elements of a vehicle according to the present invention, FIG. 5 is an enlarged cross-sectional view showing states before and after contraction of the bellows coupler and the bellows in the heat exchanger for cooling electrical elements of a vehicle according to the present invention, FIG. 6 is a front cross-sectional view showing the state before contraction of the heat exchanger for cooling electrical elements of a vehicle according to the present invention, and FIG. 7 is a front cross-sectional view showing the state after contraction of the heat exchanger for cooling electrical elements of a vehicle according to the present invention.

A heat exchanger 1 for cooling electrical elements of a vehicle according to an exemplary embodiment of the present invention is described hereafter with reference to FIGS. 1 to 7.

Referring to FIG. 1, the heat exchanger 1 for cooling electrical elements of a vehicle according to the present invention includes a pair of coolers 100, pipe couplers 200, bellows couplers 300, and a bellows 400.

Referring to FIG. 2, the pair of coolers 100 are disposed over and under an electrical element module guide 10, respectively, and each have a plurality of channels longitudinally formed to pass cooling fluid. Cooling fluid flowing inside through a pipe 20 to be described below may flow through the plurality of channels formed in the pair of coolers 100. The electrical element module guide 10, which is provided to fix electrical element modules, may be an injected plastic part.

The pair of coolers 100 each may have a metal plate 110, which is made of metal such as aluminum having high thermal conductivity, on a surface facing the electrical element module guide 10 to increase heat exchange efficiency.

The pipe couplers 200 are coupled to first ends of the pair of coolers 100, respectively, to pass cooling fluid, and may be composed of a pair of first couplers 210 and a pair of second couplers 220.

In detail, the pair of first couplers 210 respectively have protrusions 211 on surfaces facing each other with the electrical element module guide 10 therebetween. When the pair of first couplers 210 are moved toward each other, the protrusions 211 may move close to each other.

The pair of second couplers 220 are coupled to the pair of first couplers 210, respectively, and each are connected with a pipe 20. The pipe 20 may have a stopping protrusion 21 on the outer surface and the pair of second couplers 220 each may have an open protrusion 221 protruding to be in contact with the stopping protrusion 21 at an opening in which the pipe 20 is inserted. That is, the pipe 20 may be inserted in the second coupler 220 until the stopping protrusion 21 is stopped by the open protrusion 221.

A connector, a hose, etc. are fastened to the pipe 20 such that cooling fluid can flow inside or outside, but in this process, force is transmitted to the pipe 20, so the second coupler 220 connected to the pipe 20 may be bent or damaged.

In order to solve this problem, the pair of first couplers 210 having protrusions on surfaces facing each other are provided in the present invention.

Referring to FIG. 3, when the pair of first couplers 210 in the state shown in panel (a) of FIG. 3 are moved toward each other by contraction of the bellows 400 to be described below and the pair of protrusions 211 are moved close to each other, as shown in panel (b) of FIG. 3, the pair of second couplers 220 coupled to the pair of first couplers 210 are supported by the protrusions 211.

Accordingly, there is an effect that even though force is transmitted to the second coupler 220 through the pipe 20 when a connector, a hose, etc. are fastened to the pipe 20, the second coupler 220 is not easily deformed because the second coupler 220 is supported by the protrusion 211 of the first coupler 210. The protrusion 211 may also serve to distribute pressure when cooling fluid flows into the pipe 20.

Referring back to FIG. 2, it is preferable that the pipe coupler 200 has a first stopping step 230 on the inner surface thereof that limits the insertion position of the first end of the cooler 100. The first stopping step 230 is formed on the inner surfaces facing each other of the pipe couplers 200, thereby being able to decrease the width of the passage in which the first ends of the coolers 100 are inserted. That is, since the cooler 100 is inserted only to the portion stopped by the first stopping step 230 when the pipe coupler 200 is coupled to the first end of the cooler 100, it is easy to couple the first end of the cooler 100 at a predetermined position.

The bellows couplers 300 are connected to second ends of the pair of coolers 100, respectively, to pass cooling fluid, and may be composed of a pair of first couplers 310 respectively having protrusions 311 on surfaces facing each other with the electrical element module guide 10 therebetween and a pair of second couplers 320 coupled to the pair of first couplers 310, respectively.

It is preferable that the bellows coupler 300 has a second stopping step 330 formed on the inner surface and limiting the insertion position of the second end of the cooler 100. The second stopping step 330 is formed on the inner surfaces facing each other of the bellows couplers 300, thereby being able to decrease the width of the passage in which the second ends of the coolers 100 are inserted. That is, since the cooler 100 is inserted only to the portion stopped by the second stopping step 330 when the bellows coupler 300 is coupled to the second end of the cooler 100, it is easy to couple the second end of the cooler 100 at a predetermined position.

Referring to FIGS. 2 and 4, the bellows 400 has top and bottom openings 410, so it may be fitted on the protrusions 311 formed on the bellows couplers 300 and is configured to be able to contract. The bellows 400 functions as a passage connecting the pair of coolers 100, and a side thereof is made of clad and may be brazed to the bellows coupler 300.

It is preferable that the bellows 400 is configured such that the upper and lower parts are separable. A coupling groove 420 and a coupling protrusion 430 are formed around the edges of the contact surfaces of the upper part and the lower part of the bellows 400, respectively, to correspond to each other so that the upper and lower parts may be combined.

Unlike an integral type bellows 400 of the related art of which the height or the width is limited, depending on the elongation of materials, the separable type bellows 400 of the present invention has the advantage that it is possible to adjust the available contraction height by changing the height of the circumferential portion 440 and it is also possible to adjust the force for contraction by changing the width of the circumferential portion 440.

The bellows coupler 300 has a groove 312 formed around the protrusion 311 and having a shape corresponding to the bellows 400.

In detail, the bellows 400 is disposed between the bellows couplers 300 and has the top and bottom openings 410, and bellows 400 is fitted on the protrusions 311 formed at the bellows couplers 300. As shown in FIG. 4, the upper end and the lower end of the bellows 400 may be fitted to the surfaces 312a having the grooves 312 of the bellows coupler 300.

That is, the deeper the grooves 312, the larger the height between the upper end and the lower end of the bellows 400 inserted therebetween may be, so it is possible to increase the available contraction height by increasing the height of the circumferential portion 440.

As a result, it is possible to adjust the height of the bellows 400 disposed between the grooves 312 facing each other by adjusting the depths of the grooves 312, whereby the available contraction height of the bellows 400 may be adjusted. Accordingly, it is possible to easily secure a sufficient gap in which the electrical element module can be inserted in accordance with the height of the electrical element module.

It is preferable that the gap between the pair of coolers 100 is large in order to easily insert the electrical element module before contraction of the bellows 400.

To this end, there is a method of increasing the lengths of the protrusions 311 of the bellows couplers 300 to which the bellows 400 is fastened, but there is a problem that when the lengths of the protrusions 311 are increased, the gap between the pair of coolers 100 and the electrical element module is large even after contraction of the bellows 400, so the heat exchange efficiency decreases. That is, since the lengths of the protrusions 311 should be set to fit the height of the electrical element module, so the lengths cannot be infinitely increased.

On the other hand, the grooves 312 having a shape corresponding to the bellows 400 are formed around the protrusions 311 in the present invention. As shown in panel (a) of FIG. 5, the upper end and the lower end of the bellows 400 may be inserted to the surfaces 312a having the grooves 312 of the bellows couplers 300 before contraction of the bellows 400 and the circumferential portion 440 of the bellows 400 may have a large height, so the available contraction height may be increased.

As shown in panel (b) of FIG. 5, since the grooves 312 are formed around the protrusions 311 of the bellows couplers 300, when the bellows 400 contracts, the bellows 400 may be maximally deformed until the protrusions 311 come in contact with each other.

The circumferential portion 440 of the contracted and deformed bellows 400 may come in contact with the grooves 312 formed on the bellows couplers 300. In this case, the circumferential portion 440 may contract to be stably seated on the surfaces 312a having the grooves 312 because the widths of the grooves 312 are larger than the width of the circumferential portion 440 of the bellows 400.

As described above, according to the present invention, it is possible to obtain a large height difference before and after contraction of the bellows 400. That is, as shown in FIG. 6, since the bellows 400 before contracting has a height that may secure a sufficient gap between the pair of coolers 100, it is possible to secure a sufficient space in which the electrical element module can be inserted. Further, as shown in FIG. 7, since the bellows 400 may maximally contract due to the grooves 312 formed on the bellows couplers 300 when force contracting the bellows 400 is applied, it is possible to improve the efficiency of heat exchange with the electrical element module by maximally decreasing the gap between the pair of coolers 100.

Although exemplary embodiments of the present invention were described above, the technical range of the present invention is not limited thereto and should be construed on the basis of claims. Further, it should be considered that the present invention may be changed and modified in various ways by those skilled in the art without departing from the scope of the present invention.

What is claimed is:

1. A heat exchanger for cooling electrical elements of a vehicle, comprising:
    a pair of coolers disposed over and under an electrical element module, respectively, and each having a plurality of channels longitudinally formed to pass cooling fluid;
    pipe couplers respectively coupled to first ends of the pair of coolers to pass cooling fluid, having protrusions on first surfaces facing each other, respectively, and connected with pipes on second surfaces;
    bellows couplers respectively coupled to second ends of the pair of coolers to pass cooling fluid and having protrusions on first surfaces facing each other; and
    a bellows having top and bottom openings fitted on the protrusions, and being able to contract,
    wherein the bellows couplers have grooves formed around the protrusions in a shape corresponding to the bellows, and widths of the grooves are larger than a width of the bellows.

2. The heat exchanger of claim 1, wherein the bellows is configured such that upper and lower parts are separable.

3. The heat exchanger of claim 1, wherein the pipe couplers each have a first stopping step that is formed on an inner surface thereof and limits an insertion position of the first end of each of the pair of coolers.

4. The heat exchanger of claim 1, wherein the bellows couplers each have a second stopping step that is formed on an inner surface thereof and limits an insertion position of the second end of each of the pair of coolers.

* * * * *